(12) United States Patent
Rodman

(10) Patent No.: US 7,155,693 B1
(45) Date of Patent: Dec. 26, 2006

(54) FLOORPLANNING A HIERARCHICAL PHYSICAL DESIGN TO IMPROVE PLACEMENT AND ROUTING

(75) Inventor: Paul Rodman, Palo Alto, CA (US)

(73) Assignee: Magma Design Automation, Inc., Santa Clara, CA (US)

( * ) Notice: Subject to any disclaimer, the term of this patent is extended or adjusted under 35 U.S.C. 154(b) by 293 days.

(21) Appl. No.: 10/831,700

(22) Filed: Apr. 23, 2004

Related U.S. Application Data

(60) Provisional application No. 60/465,115, filed on Apr. 23, 2003.

(51) Int. Cl.
*G06F 17/50* (2006.01)

(52) U.S. Cl. .................. 716/8; 716/9; 716/10; 716/11; 716/12

(58) Field of Classification Search ................ 716/8–14
See application file for complete search history.

(56) References Cited

U.S. PATENT DOCUMENTS

| | | | |
|---|---|---|---|
| 5,309,371 A * | 5/1994 | Shikata et al. ................ 716/10 |
| 6,080,204 A | 6/2000 | Mendel | |
| 6,111,310 A | 8/2000 | Schultz | |
| 6,306,745 B1 | 10/2001 | Chen | |
| 6,408,427 B1 | 6/2002 | Cong et al. | |
| 6,467,074 B1 * | 10/2002 | Katsioulas et al. ............ 716/8 |
| 6,519,749 B1 * | 2/2003 | Chao et al. .................... 716/9 |
| 6,701,509 B1 | 3/2004 | Aggarwal et al. | |
| 6,772,401 B1 * | 8/2004 | Li ............................... 716/11 |
| 6,857,116 B1 | 2/2005 | Dahl et al. | |
| 6,876,960 B1 | 4/2005 | Naylor et al. | |
| 2005/0097488 A1 | 5/2005 | Lakshmanan et al. | |

* cited by examiner

*Primary Examiner*—Paul Dinh
(74) *Attorney, Agent, or Firm*—Fenwick & West LLP

(57) ABSTRACT

Methods for floorplanning a hierarchical physical design to improve placement and routing are provided and described. In one embodiment, a method of floorplanning a hierarchical physical design includes arranging a plurality of blocks in a top-level of the hierarchical physical design. Each block includes a plurality of linear edges. Additionally, at least one of the blocks is selected. Furthermore, at least one linear edge of the selected block is rasterized. This rasterization includes converting the linear edge to a stepped-shape edge.

12 Claims, 21 Drawing Sheets

400A

300A

300B

400C

500A

610

610

FLOORPLANNING A HIERARCHICAL PHYSICAL DESIGN TO IMPROVE PLACEMENT AND ROUTING

CROSS REFERENCE TO RELATED APPLICATION

This patent application claims the benefit of copending U.S. Provisional Patent Application Ser. No. 60/465,115, filed Apr. 23, 2003, entitled "ADVANCED BLOCK FLOORPLANNING IN ABUTTED HIERARCHICAL CHIP DESIGN," by Paul Rodman.

BACKGROUND OF THE INVENTION

1. Field of the Invention

The present invention generally relates to floorplanning a physical design for an integrated circuit chip. More particularly, the present invention relates to the field of floorplanning a hierarchical physical design to improve placement and routing.

2. Related Art

The process of generating a physical design for an integrated circuit chip is complicated. The physical design represents the layout of the integrated circuit chip on a semiconductor, such as silicon, and is utilized to fabricate the integrated circuit chip. There are several types of physical designs: flat physical designs and hierarchical physical designs. Typically, the physical design is generated in several stages. Examples of these stages include floorplanning, placement, routing, and verification. In a flat physical design these stages are sequentially performed on the entire layout, while in a hierarchical physical design these stages are sequentially performed on partitions of the layout referred as blocks (or place-and-route blocks).

Floorplanning is performed before placement and routing. Thus, floorplanning affects subsequent stages such as placement and routing. The main goal and objective of floorplanning is creating a floorplan. The floorplan can determine whether placement and routing are possible for the physical design.

During the top-level floorplanning stage of a hierarchical physical design, blocks are arranged on a selected chip area and chip shape. In arranging the blocks, individual blocks are sized and shaped. These blocks can have any number of cells that execute digital or analog functions (e.g., NAND, NOR, D flip-flop, etc.) by connectively grouping circuit elements such as transistors, capacitors, resistors, and other circuit elements. Moreover, these blocks can have one or more macrocells. A macrocell is a functional module such as RAM, ROM, ALU, etc. Each of these cells and macrocells has one or more ports (or terminals) for inputting signals or outputting signals, each of which, in turn, may connect to one or more ports of other cells and macrocells via metal wires. A net is a set of two or more ports that are connected. Generally, the input to the floorplanning stage is a netlist for the integrated circuit chip. A netlist is a list of nets for the integrated circuit chip.

Continuing, the location of Input/Output blocks is determined. These Input/Output blocks facilitate connections/communication with external components. An Input/Output block may have bonding pad cells or bump cells. Moreover, power distribution and clock distribution are determined during the top-level floorplanning stage of the hierarchical physical design. Furthermore, the top-level floorplanning stage is performed with the objectives of minimizing the chip area and minimizing delay.

SUMMARY OF THE INVENTION

Methods for floorplanning a hierarchical physical design to improve placement and routing are provided and described. In one embodiment, a method of floorplanning a hierarchical physical design includes arranging a plurality of blocks in a top-level of the hierarchical physical design. Each block includes a plurality of linear edges. Additionally, at least one of the blocks is selected. Furthermore, at least one linear edge of the selected block is rasterized. This rasterization includes converting the linear edge to a stepped-shape edge.

In another embodiment, a method of floorplanning a hierarchical physical design includes performing an initial flat placement using a netlist of the hierarchical physical design. Continuing, a plurality of partitions of the netlist in the initial flat placement are identified, wherein each partition has a boundary. Moreover, a top-level floorplan for the hierarchical physical design is generated using the initial flat placement. In generating the top-level floorplan, a corresponding block for each identified partition is generated by converting the boundary of the identified partition into a plurality of edges. The plurality of edges includes at least one stepped-shape edge.

In yet another embodiment, a method of floorplanning a hierarchical physical design includes arranging a plurality of blocks in a top-level of the hierarchical physical design. An area unoccupied by the blocks and surrounding at least one of the blocks is selected. Moreover, the area is designated as an additional block, wherein the additional block has a gap where the surrounded block is located.

In still another embodiment, a method of floorplanning a physical design includes assigning a priority attribute to each one of a plurality of blocks. Each priority attribute determines which block owns any overlap area relative to another block. Continuing, the blocks are arranged to form one or more overlap areas. Each overlap area is allocated to one of the blocks based on the assigned priority attribute of the blocks.

In another embodiment, a method of floorplanning a hierarchical physical design includes arranging a plurality of blocks in a top-level of the hierarchical physical design. Moreover, a plurality of nets is routed in the top-level of the hierarchical physical design to determine pin locations for each block. Each pin of each block represents one of a location where a signal enters the block and a location where a signal exits the block. Continuing, it is determined whether a routed net includes a plurality of segments within a block. Furthermore, one or more of the segments are renamed.

BRIEF DESCRIPTION OF THE DRAWINGS

The accompanying drawings, which are incorporated in and form a part of this specification, illustrate embodiments of the invention and, together with the description, serve to explain the principles of the present invention.

DETAILED DESCRIPTION OF THE INVENTION

Reference will now be made in detail to embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details.

Methods for floorplanning a hierarchical physical design to improve placement and routing are provided and described herein. The following description of the invention is applicable to physical designs for integrated circuit chips. Moreover, the invention can be practiced on the entire physical design. Additionally, the invention can be practiced on a portion of the physical design, and then this portion of the physical design can be integrated with the rest of the physical design.

Although the description of the invention will focus on hierarchical physical designs, it should be understood that the invention is applicable to other types of physical designs. Moreover, the description of the invention will focus on an abutted-pin hierarchical physical design. It should be understood that the invention is applicable to other types of hierarchical physical designs.

A detailed description of an abutted-pin hierarchical physical design can be found in the co-pending, commonly-owned U.S. patent application Ser. No. 09/714,722, filed on Nov. 15, 2000, entitled "OPTIMIZATION OF ABUTTED-PIN HIERARCHICAL PHYSICAL DESIGN", by Dahl et al., which is incorporated herein by reference.

As discussed above, the floorplanning stage of a hierarchical physical design affects subsequent physical design stages such as placement and routing. If the floorplanning stage takes into account the goals, objectives, and causes of problems associated with the placement and routing stages, a floorplan is generated which can facilitate, enhance, and optimize the placement and routing stages.

Figure 1A:
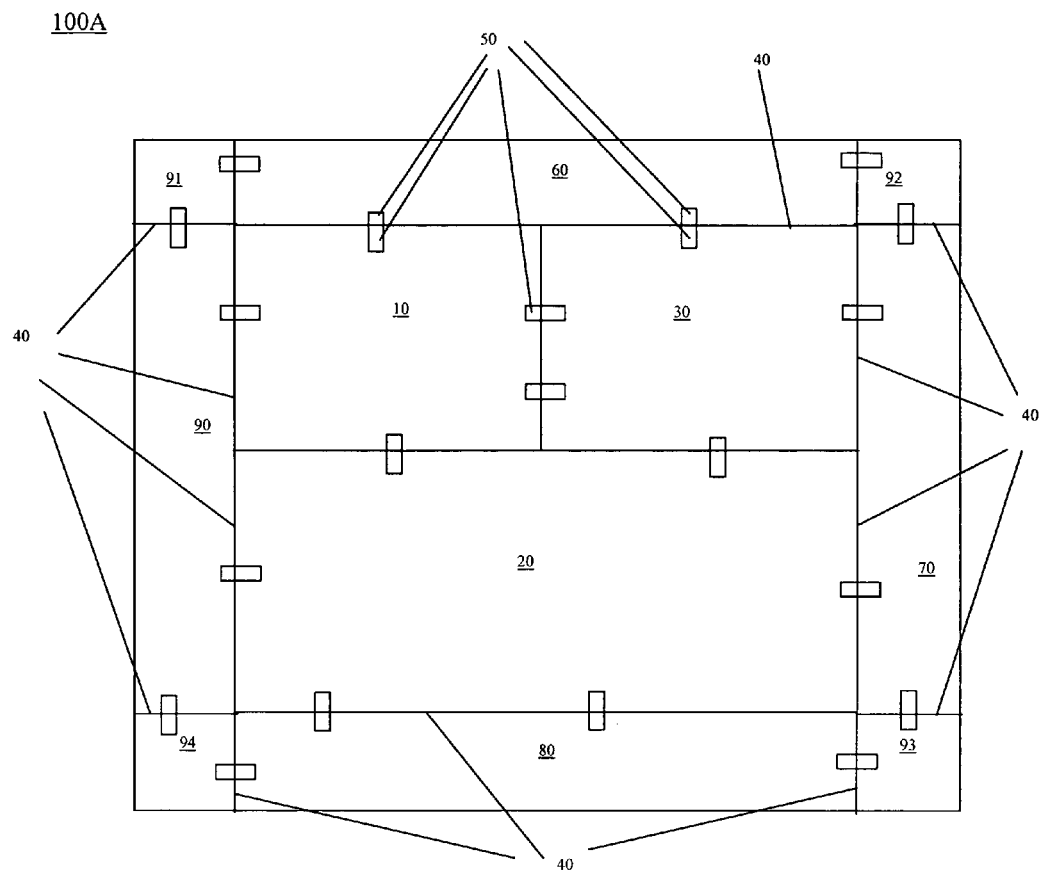
FIG. 1A illustrates a top-level floorplan of an abutted-pin hierarchical physical design in accordance with an embodiment of the present invention.

FIG. 1A illustrates a top-level floorplan 100A of an abutted-pin hierarchical physical design in accordance with an embodiment of the present invention. As depicted in FIG. 1A, the top-level floorplan 100A includes a plurality of blocks 10–30 and 60–94. The blocks 10–30 and 60–94 are partitions of the netlist, which is provided as an input to the floorplanning stage. These blocks 10–30 and 60–94 are also referred to as place-and-route blocks (pnr blocks). One distinguishing feature of the top-level floorplan 100A of an abutted-pin hierarchical physical design is the lack of routing channels between the blocks 10–30 and 60–94. Here, edges 40 of one block abut edges 40 of another block. Hence, the entire chip area and chip shape utilized in the top-level floorplan 100A is covered with blocks 10–30 and 60–94. Another distinguishing feature of the top-level floorplan 100A of an abutted-pin hierarchical physical design is the merging of traditional top-level components or objects (e.g., timing components, clock distribution wiring, power distribution wiring, repeaters, buffers, etc.) into the individual blocks 10–30 and 60–94 and corresponding block-level netlists.

Continuing with FIG. 1A, blocks 10–30 form a core area of the top-level floorplan 100A. These blocks 10–30 have cells and macrocells providing the primary digital and/or analog functionality of the integrated circuit chip fabricated using this top-level floorplan 100A. Blocks 60–94 form a padring area of the top-level floorplan 100A. These blocks 60–94 have bonding pad cells or bump cells and other support circuitry cells of the integrated circuit chip fabricated using this top-level floorplan 100A. Although the blocks 10–30 and 60–94 have rectangular shapes, it should be understood that the blocks 10–30 and 60–94 can have rectilinear shapes. Moreover, it should be understood that the top-level floorplan 100A can have more or less than the blocks depicted in FIG. 1A.

As described above, blocks 10–30 and 60–94 can have cells and macrocells. Each of these cells and macrocells has one or more ports (or terminals) for inputting signals or outputting signals, each of which, in turn, may connect to one or more ports of other cells and macrocells via metal wires. A net is a set of two or more ports that are connected.

Each block 10–30 and 60–94 has one or more pins 50. Each pin 50 of a block 10–30 and 60–94 represents a location where a signal enters the block or a location where a signal exits the block. The pins 50 are utilized in placing and routing each block during block-level operations. At the top-level of a hierarchical physical design (e.g., an abutted-pin hierarchical physical design), a router is used to route nets representing two or more ports of different blocks that are connected. In general, a location of a pin 50 is defined where the routing wire crosses the boundary or edge 40 of the block. Since boundaries or edges 40 of one block 10–30 and 60–94 abut boundaries or edges 40 of another block 10–30 and 60–94, the pin 50 of one block 10–30 and 60–94 abuts the pin 50 of another block 10–30 and 60–94, as shown in the top-level floorplan 100A for an abutted-pin hierarchical physical design in FIG. 1A.

Figure 1B:
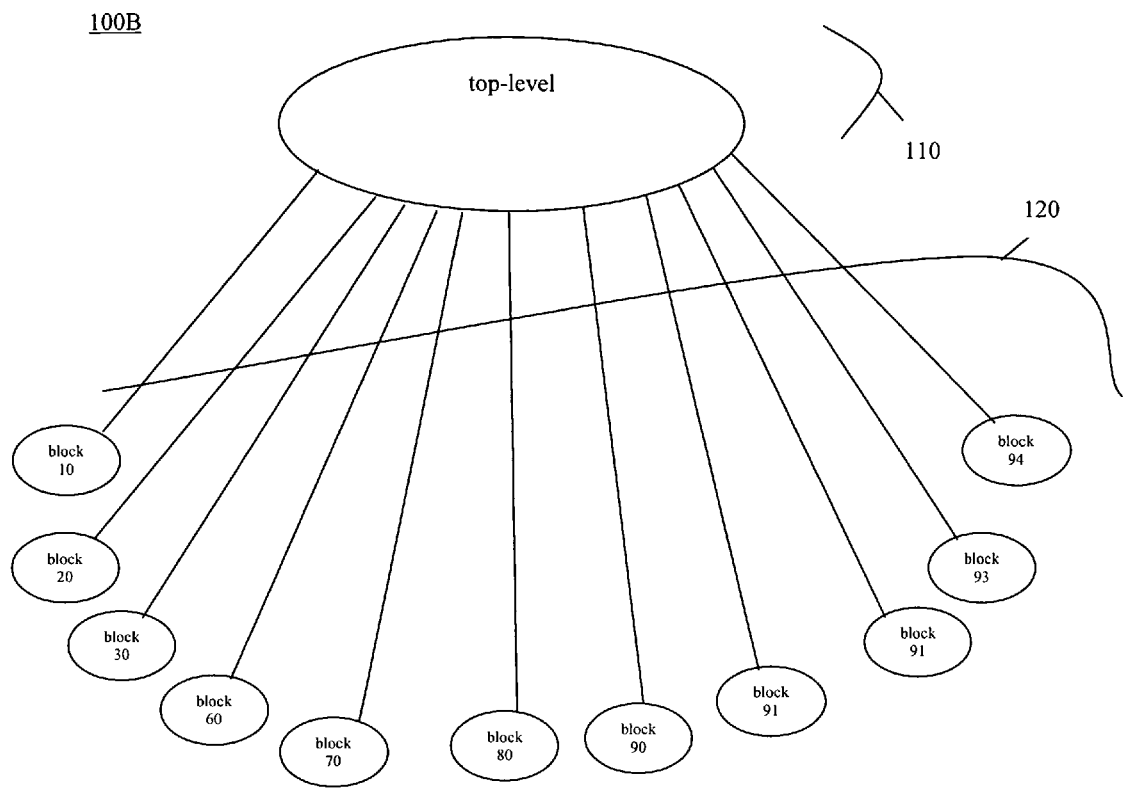
FIG. 1B illustrates the two-level hierarchy of the abutted-pin hierarchical physical design of FIG. 1A in accordance with an embodiment of the present invention.

FIG. 1B illustrates the two-level hierarchy 100B of the abutted-pin hierarchical physical design of FIG. 1A in accordance with an embodiment of the present invention. The two-level hierarchy 100B includes a top-level 110 and a block-level 120. The top-level 110 has the top-level floorplan 100A described with respect to FIG. 1A. Block-level 120 includes each block 10–30 and 60–94 of top-level floorplan 100A. The cells and macrocells of individual blocks 10–30 and 60–94 can be placed and routed in parallel, reducing physical design time and enabling higher magnitudes of optimization.

Figure 2:
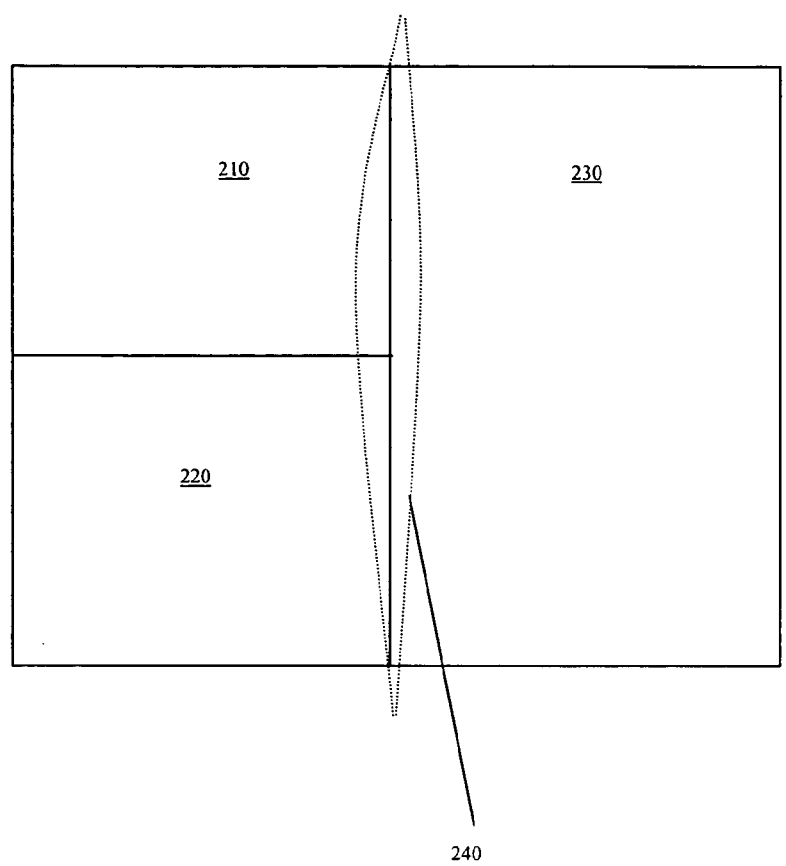
FIG. 2 illustrates a first top-level floorplan of the core area of a hierarchical physical design in accordance with an embodiment of the present invention.

FIG. 2 illustrates a first top-level floorplan 200 of the core area of a hierarchical physical design (e.g., abutted-pin hierarchical physical design) in accordance with an embodiment of the present invention. Here, the first top-level floorplan 200 has three rectangular blocks 210, 220, and 230, wherein the blocks 210, 210, and 230 are sized and shaped into an abutted arrangement to cover the entire core area. The edge 240 of block 230 abuts blocks 210 and 220.

After analyzing the first top-level floorplan 200, it is determined that the size of at least one of the blocks 210, 220, and 230 has to be increased in order to successfully complete the placement and routing phases at the block-level. However, there is no additional space in the core area. In one solution, a larger chip area and/or different chip shape is selected. This solution significantly increases costs. In a second solution, the size of at least one of the blocks 210, 220, and 230 is decreased sufficiently to meet the demand for additional space in the core area, but the decrease in size does not cross the threshold that prevents successfully completion of the placement and routing phases at the block-level. In general, this results in a floorplan having one or more rectilinear blocks.

Figure 3A:
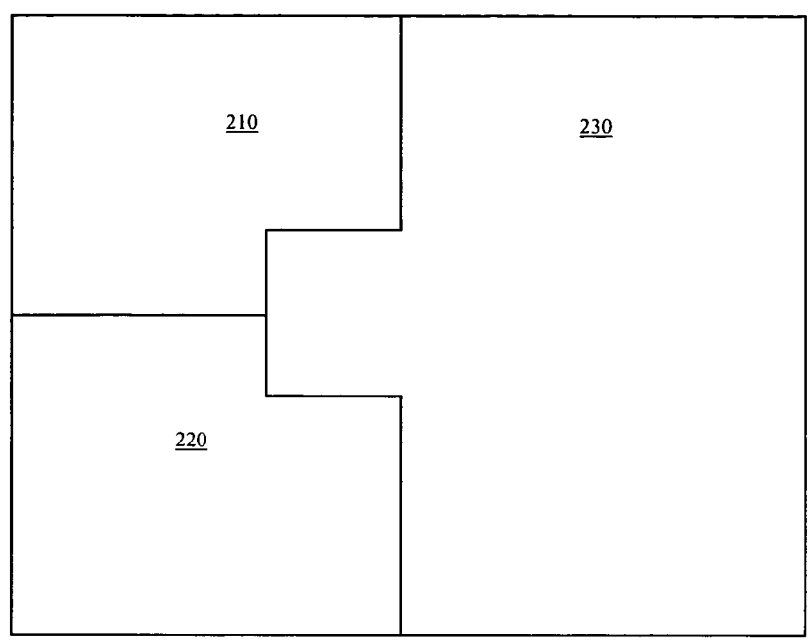
FIG. 3A illustrates a second top-level floorplan of the core area of a hierarchical physical design in accordance with an embodiment of the present invention.
Figure 3B:
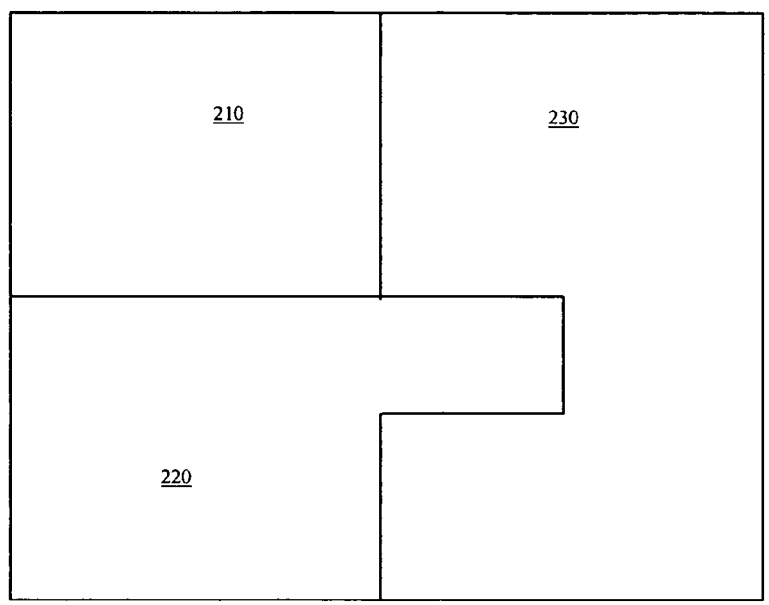
FIG. 3B illustrates a third top-level floorplan of the core area of a hierarchical physical design in accordance with an embodiment of the present invention.

FIGS. 3A and 3B illustrate resulting floorplans after re-sizing the blocks 210, 220, and 230 of FIG. 2 according to the second solution described above. In FIG. 3A, the size of block 230 was increased while in FIG. 3B the size of block 220 was increased.

A second top-level floorplan 300A of the core area of a hierarchical physical design in accordance with an embodiment of the present invention is shown in FIG. 3A. In the second top-level floorplan 300A, the size of block 230 was increased in a concave manner while the size of blocks 210 and 220 was decreased. Here, blocks 210, 220, and 230 have rectilinear shapes instead of rectangular shapes.

A third top-level floorplan 300B of the core area of a hierarchical physical design in accordance with an embodiment of the present invention is shown in FIG. 3B. In the third top-level floorplan 300B, the size of block 220 was increased while the size of block 230 was decreased in a convex manner. Also, blocks 220 and 230 have rectilinear shapes instead of rectangular shapes.

Both the second top-level floorplan 300A and the third top-level floorplan 300B are not efficient and optimal because the rectilinear shapes of blocks 210, 220, and 230 (FIG. 3A) and blocks 220 and 230 (FIG. 3B) typically create routing congestion zones (or routing hot spots) that complicate the placement and routing phases at the block-level. Instead of selecting a larger chip area and/or different chip shape, flexibility in shaping the blocks 210, 220, and 230 into rectilinear shapes with no or minimal routing congestion zones can lead to a floorplan that facilitates, enhances, and optimizes the placement and routing stages at the block-level.

Figure 4A:
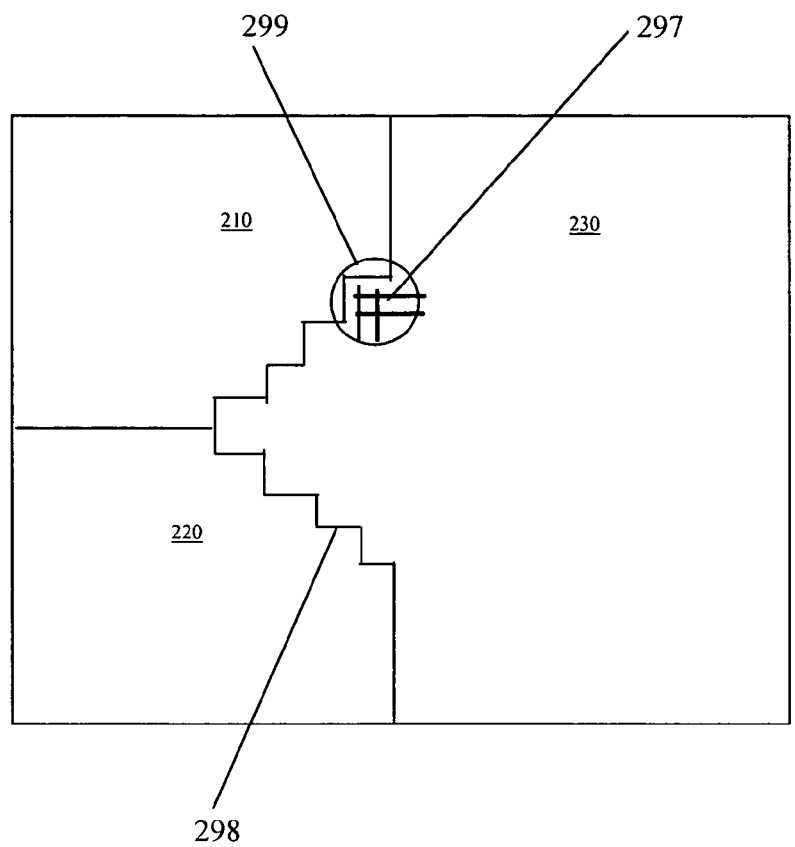
FIG. 4A illustrates a first top-level floorplan showing rasterization in the core area of a hierarchical physical design in accordance with an embodiment of the present invention.
Figure 4B:
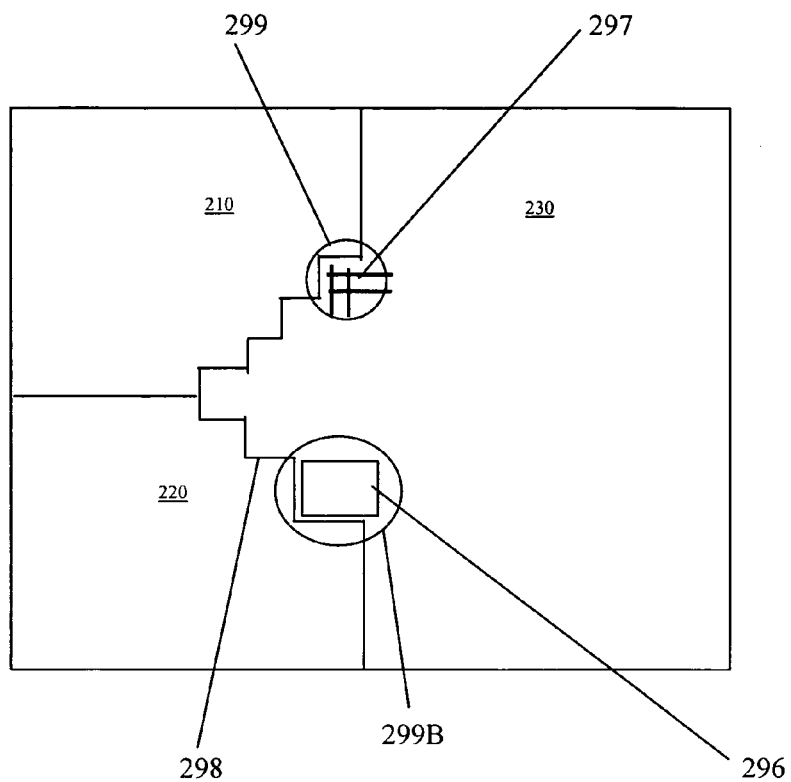
FIG. 4B illustrates a second top-level floorplan showing rasterization in the core area of a hierarchical physical design in accordance with an embodiment of the present invention.
Figure 4C:
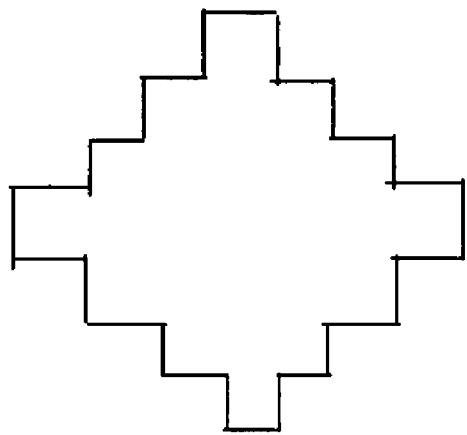
FIG. 4C illustrates a diamond-shape block in accordance with an embodiment of the present invention.

A method of floorplanning a hierarchical physical design is depicted in FIGS. 4A–4C in accordance with an embodiment of the present invention. This method includes arranging a plurality of blocks in a top-level of the hierarchical physical design. Each block includes a plurality of linear edges. Additionally, at least one of the blocks is selected. Furthermore, at least one linear edge of the selected block is rasterized. This rasterization includes converting the linear edge to a stepped-shape edge.

FIG. 4A illustrates a first top-level floorplan 400A showing rasterization in the core area of a hierarchical physical design in accordance with an embodiment of the present invention. When a linear edge of a selected block is rasterized, the linear edge is converted to a stepped-shape edge. Relative to the size of blocks 210, 220, and 230 in FIG. 2, rasterization increases the size of block 230 and decreases the size of blocks 210 and 220. In particular, rasterization provides a smoother edge transition relative to the edge transition of blocks 210, 220, and 230 in FIGS. 3A and 3B. This smoother edge transition eliminates or reduces routing congestion zones associated with the top-level floorplans 300A and 300B of FIGS. 3A and 3B, respectively. Thus, rasterization provides flexibility in shaping the blocks 210, 220, and 230 during the floorplanning stage.

Referring to FIG. 4A, the stepped-shape edge 298 includes a plurality of steps 299. In an embodiment, each step 299 is sized to avoid dividing a routing track 297. As an example, a step 299 can be sized to include between 2 and 10 routing tracks. Routing tracks 297 can have a horizontal orientation or a vertical orientation.

FIG. 4B illustrates a second top-level floorplan 400B showing rasterization in the core area of a hierarchical physical design in accordance with an embodiment of the present invention. The discussion with respect to FIG. 4A is applicable to FIG. 4B. Moreover, FIG. 4B further illustrates that a step 299B of the stepped-shape edge 298 is sized according to a cell 296 of block 230. Thus, there is flexibility in sizing the individual steps of the stepped-shape edge 298. This situation will generally occur when the placement of cell 296 within block 230 requires placing cell 296 near or at the stepped-shape edge 298.

FIG. 4C illustrates a diamond-shape block 400C in accordance with an embodiment of the present invention. Here, the linear edges of a block have been rasterized to create the diamond-shape block 400C. The diamond-shape block 400C can be used during the floorplanning stage. In particular, this shape can reduce the average routing wire length within the diamond-shape block 400C, reducing delay and reducing routing resources.

Figure 5A:
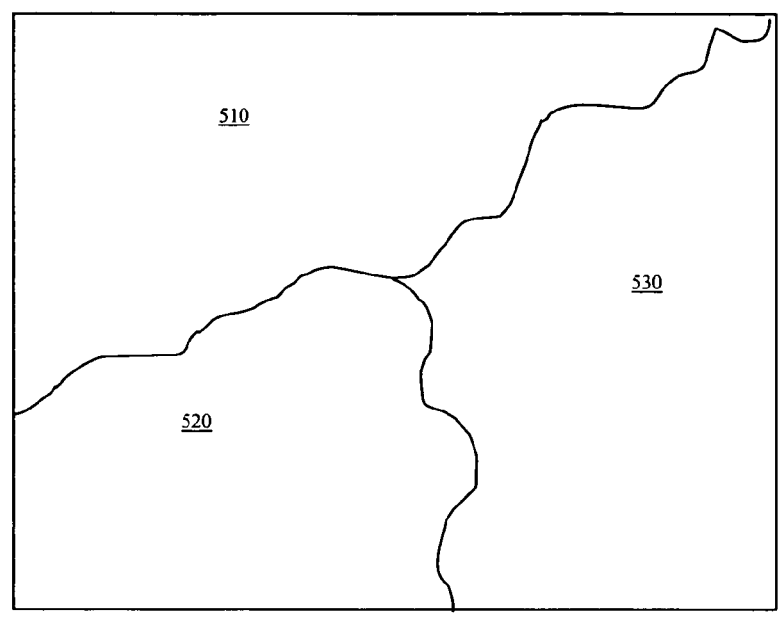
FIG. 5A illustrates an initial flat placement of a netlist of a hierarchical physical design in accordance with an embodiment of the present invention.
Figure 5B:
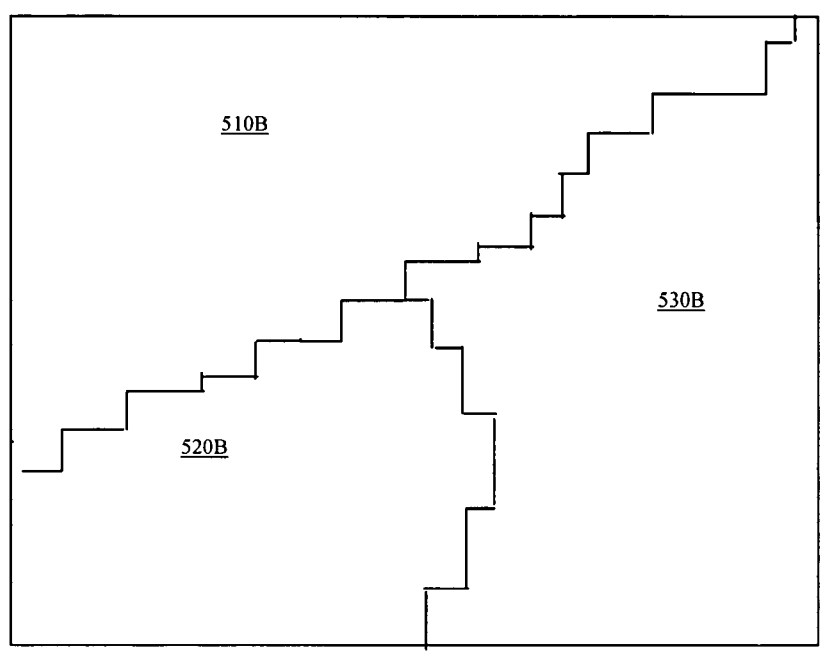
FIG. 5B illustrates a top-level floorplan for a hierarchical physical design generated from the initial flat placement in accordance with an embodiment of the present invention.

A method of floorplanning a hierarchical physical design is depicted in FIGS. 5A–5B in accordance with an embodiment of the present invention. This method includes performing an initial flat placement using a netlist of the hierarchical physical design. Continuing, a plurality of partitions of the netlist in the initial flat placement are identified, wherein each partition has a boundary. Moreover, a top-level floorplan for the hierarchical physical design is generated using the initial flat placement. In generating the top-level floorplan, a corresponding block for each identified partition is generated by converting the boundary of the identified partition into a plurality of edges. The plurality of edges includes at least one stepped-shape edge.

FIG. 5A illustrates an initial flat placement 500A of a netlist of a hierarchical physical design in accordance with an embodiment of the present invention. Only the core area is shown. The initial flat placement 500A is performed to identify partitions 510, 520, and 530 of the netlist and to obtain information in order to size and to shape blocks for the top-level floorplan for the hierarchical physical design. Typically, the initial flat placement 500A can be performed faster than the detailed flat placement because the initial flat placement 500A indicates a rough placement of cells without fully meeting the design specifications. As shown in FIG. 5A, each identified partition 510, 520, and 530 has a boundary.

In particular, the initial flat placement 500A will be used to generate a top-level floorplan. FIG. 5B illustrates a top-level floorplan 500B for a hierarchical physical design generated from the initial flat placement 500A of FIG. 5A in accordance with an embodiment of the present invention. As depicted in FIG. 5B, a block 510B, 520B, and 530B is generated for each identified partition 510, 520, and 530 of FIG. 500A. The shape and size of blocks 510B, 520B, and 530B are based on the boundaries of each identified partition 510, 520, and 530 of FIG. 500A. The boundaries of each identified partition 510, 520, and 530 of FIG. 500A are converted into edges. Moreover, some of the edges are stepped-shape edges 540. These stepped-shape edges 540 can be formed using a curve fitting technique applied to the boundaries of the each identified partition 510, 520, and 530 of FIG. 500A.

A method of floorplanning a hierarchical physical design is depicted in FIGS. 6A–6E in accordance with an embodiment of the present invention. This method includes arranging a plurality of blocks in a top-level of the hierarchical physical design. An area unoccupied by the blocks and surrounding at least one of the blocks is selected. Moreover, the area is designated as an additional block, wherein the additional block has a gap where the surrounded block is located.

Figure 6A:
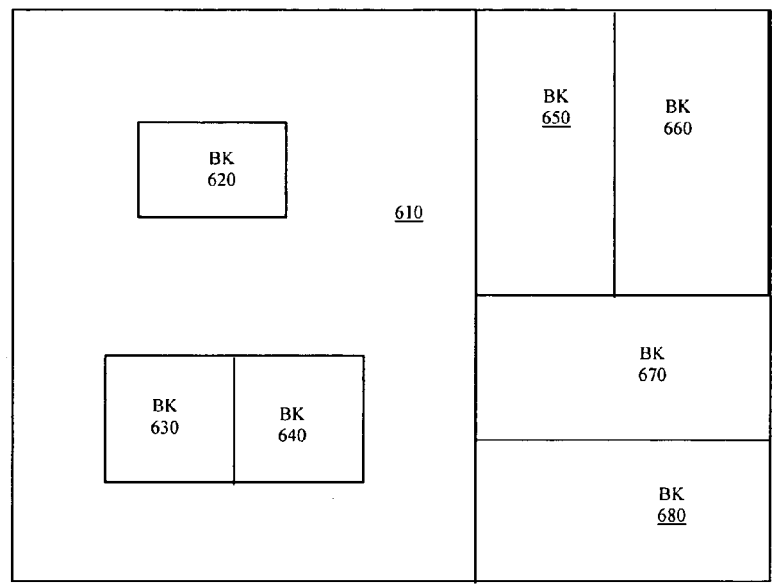
FIG. 6A illustrates an incomplete top-level floorplan for a hierarchical physical design in accordance with an embodiment of the present invention.

FIG. 6A illustrates an incomplete top-level floorplan 600A for a hierarchical physical design in accordance with an embodiment of the present invention. Only the core area is shown. As depicted in FIG. 6A, the incomplete top-level floorplan 600A has a plurality of blocks 620–680 arranged during the floorplanning stage to meet design specifications. However, area 610 is unoccupied by the blocks 620–680. Moreover, the area 610 surrounds blocks 620–640. Moreover, there are additional portions of the netlist of the hierarchical physical design that have not yet been assigned to any of the blocks 620–680 because of the design specifications.

Figure 6B:
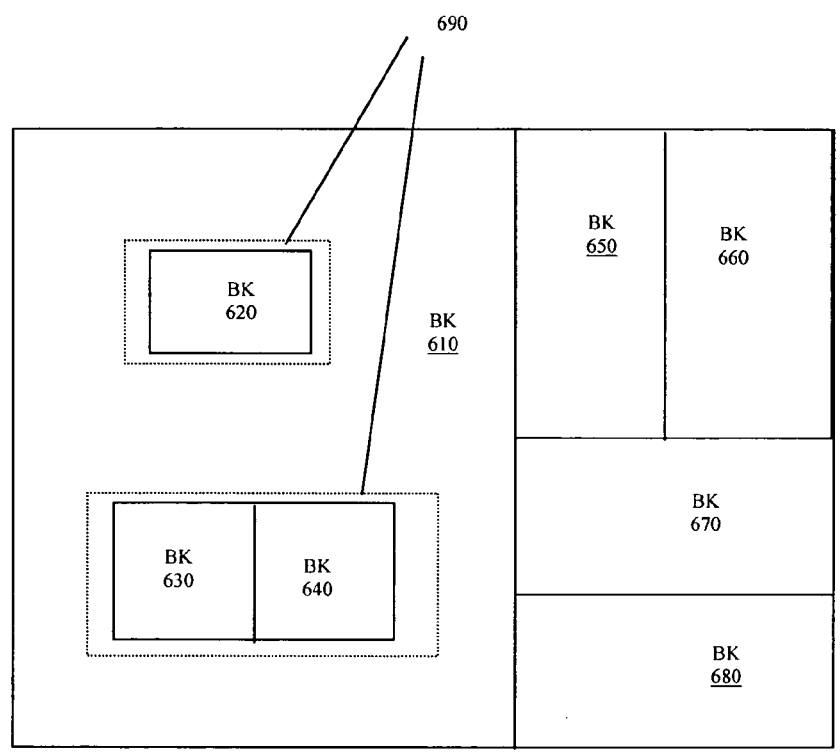
FIG. 6B illustrates a completed top-level floorplan for a hierarchical physical design in accordance with an embodiment of the present invention, showing a block having gaps.

Further, FIG. 6B illustrates a completed top-level floorplan 600B for a hierarchical physical design in accordance with an embodiment of the present invention, showing a block 610 having gaps. The area 610 of incomplete top-level floorplan 600A of FIG. 6A has been selected and designated as a block 610. This block 610 has gaps 690 where the surrounded blocks 620–640 are located. Block 610 allows flexibility in keeping cells that communicate with each other a significant amount together in the same block, helping to optimize timing. It should be understood that the block 610 can have more or less than two gaps.

Figure 6C:
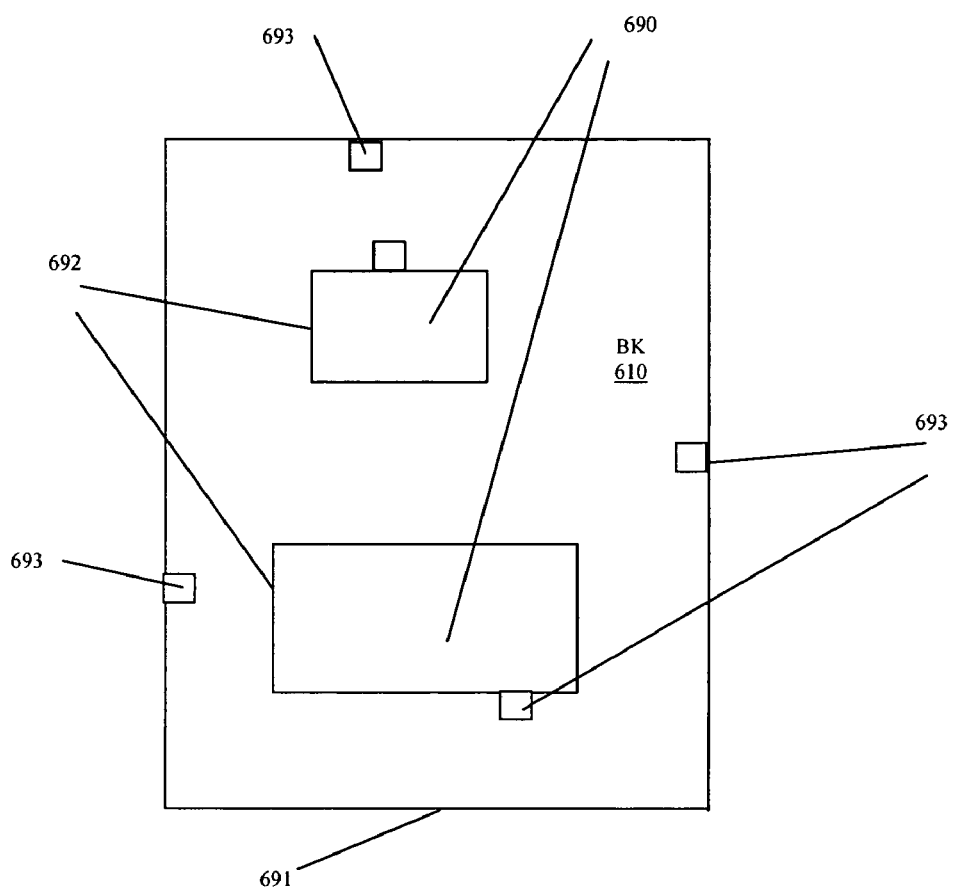
FIG. 6C illustrates a block having gaps in accordance with an embodiment of the present invention.

The block 610 having gaps of FIG. 6B is shown in accordance with an embodiment of the present invention in FIG. 6C. As depicted in FIG. 6C, the block 610 has gaps 690, an internal edge 692, and an external edge 691. The edges 691 and 692 are configured for locating pins 693 thereon. Each pin 693 represents a location where a signal enters the block 610 or a location where a signal exists the block 610. Some of the pins 693 may be feedthroughs for the surrounded blocks 620–640.

Figure 6D:
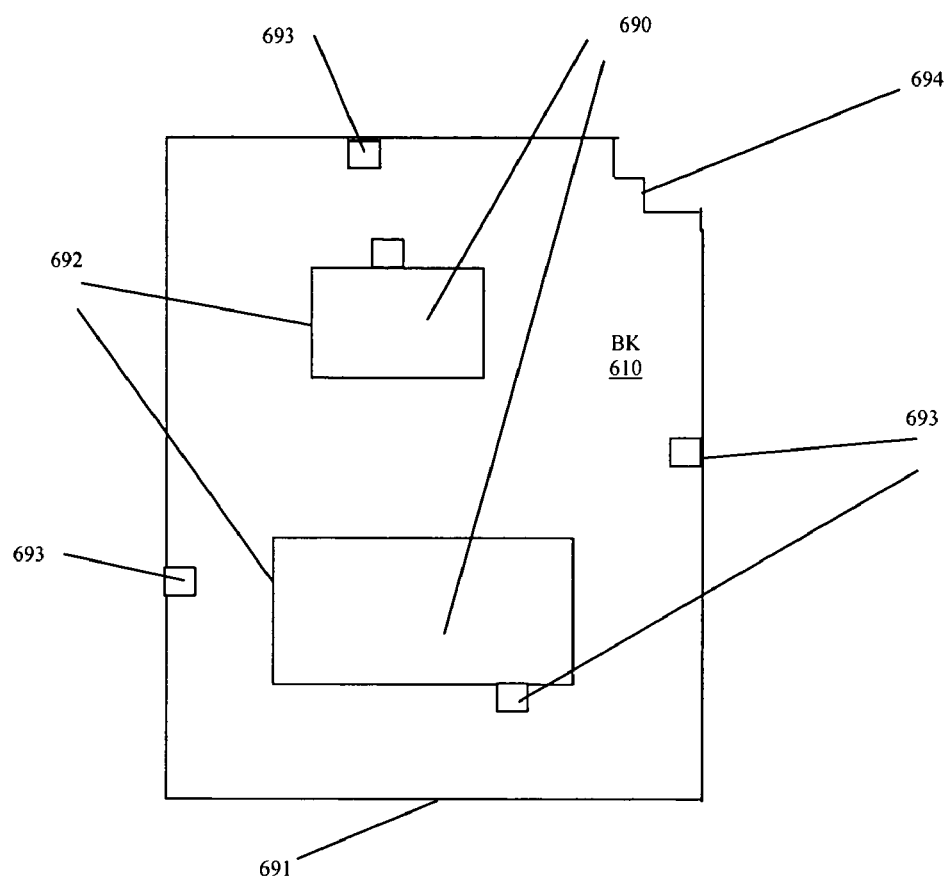
FIG. 6D illustrates a block having gaps and a stepped-shape edge in accordance with an embodiment of the present invention.

Moreover, the block 610 having gaps of FIG. 6B is shown in accordance with an embodiment of the present invention in FIG. 6D, showing a stepped-shape edge 694. This illustrates that the block 610 can have gaps 690 and a stepped-shape edge 694.

Figure 6E:
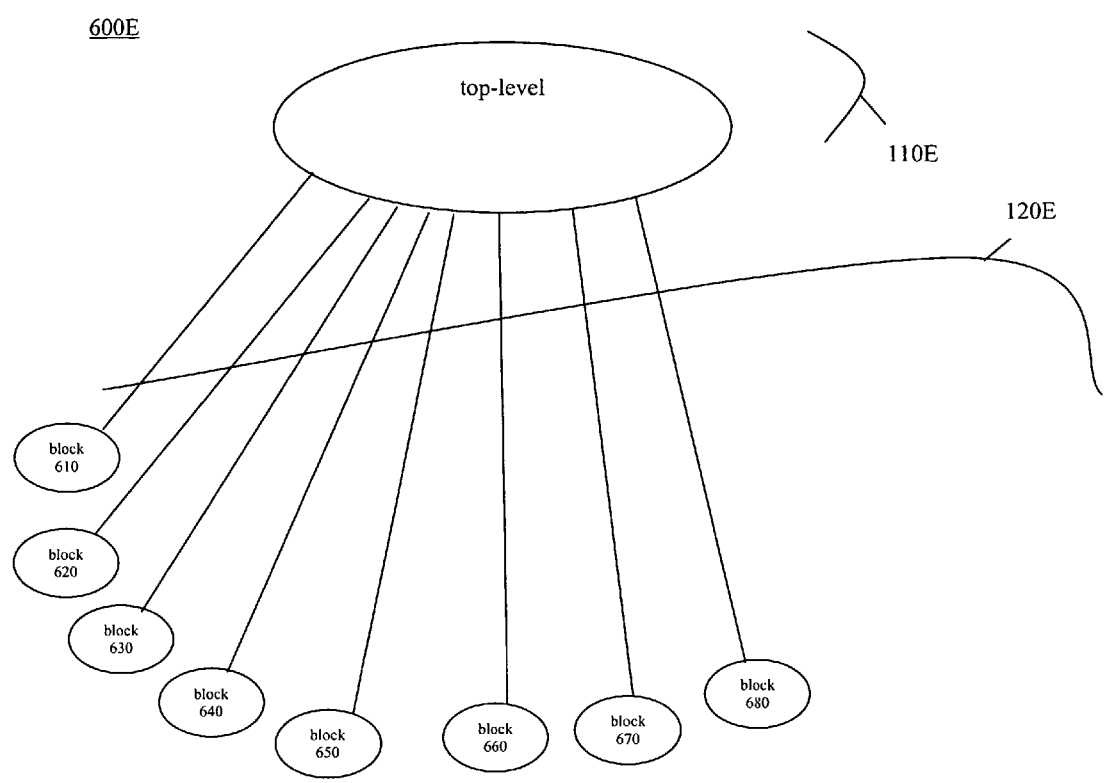
FIG. 6E illustrates the two-level hierarchy of the hierarchical physical design of FIG. 6B in accordance with an embodiment of the present invention.

FIG. 6E illustrates the two-level hierarchy 600E of the hierarchical physical design of FIG. 6B in accordance with an embodiment of the present invention. The two-level hierarchy 600E includes a top-level 110E and a block-level 120E. The top-level 110E has the top-level floorplan 600B described with respect to FIG. 6B. Block-level 120B includes each block 610–680 of top-level floorplan 600B. The cells and macrocells of individual blocks 610–680 can be placed and routed in parallel, reducing physical design time and enabling higher magnitudes of optimization.

Figure 7A:
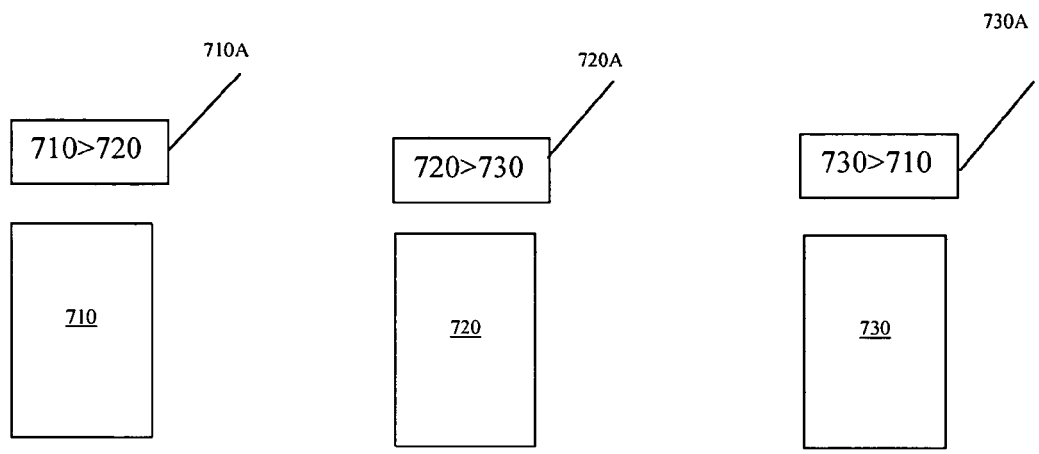
FIG. 7A illustrates a plurality of blocks having a priority attribute in accordance with an embodiment of the present invention.
Figure 7B:
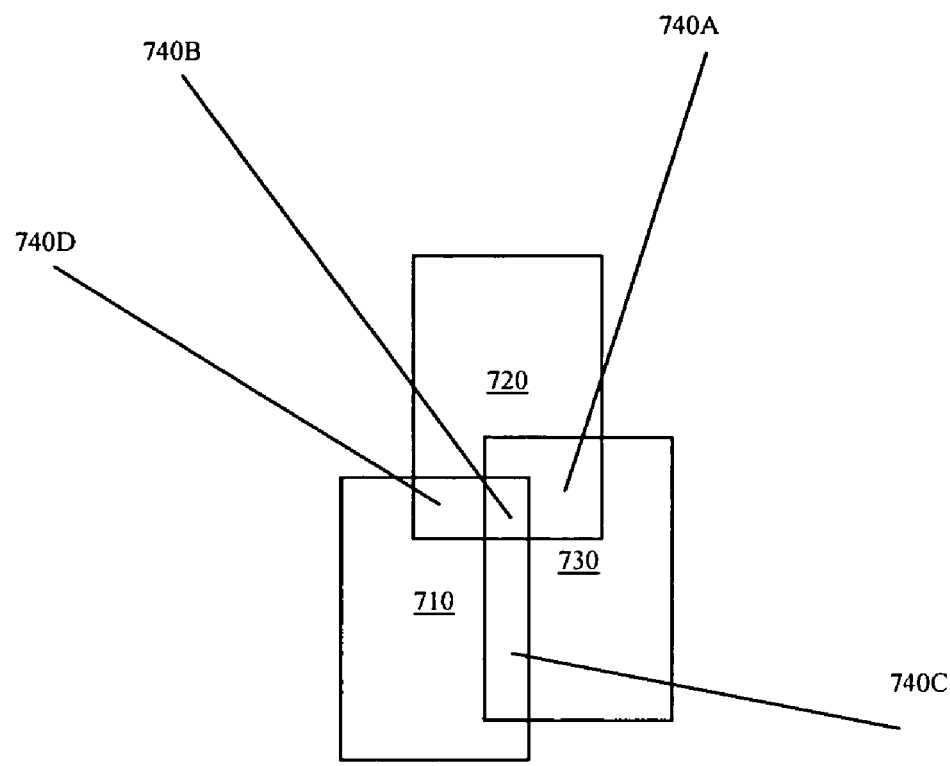
FIG. 7B illustrates arrangement of the blocks of FIG. 7A to form overlap areas in accordance with an embodiment of the present invention.
Figure 7C:
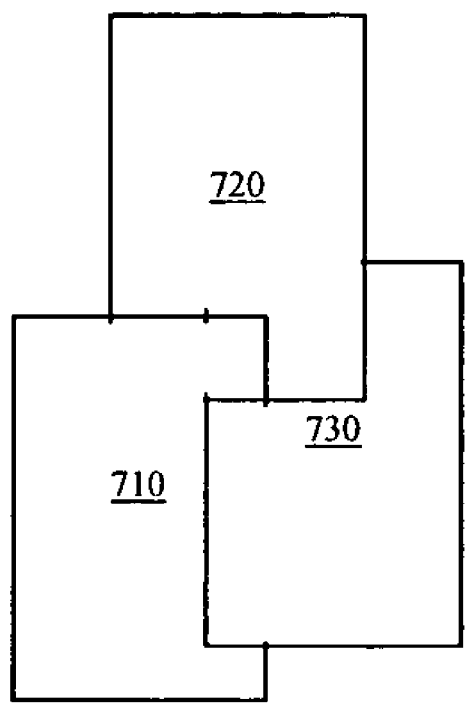
FIG. 7C illustrates allocation of the overlap areas of FIG. 7B based on the priority attributes in accordance with an embodiment of the present invention.

A method of floorplanning a physical design is show in FIGS. 7A–7C in accordance with an embodiment of the present invention. The method includes assigning a priority attribute to each one of a plurality of blocks. Each priority attribute determines which block owns any overlap area relative to another block. Continuing, the blocks are arranged to form one or more overlap areas. Each overlap area is allocated to one of the blocks based on the assigned priority attribute of the blocks.

Referring to FIG. 7A, a plurality of blocks 710–730 having a priority attribute in accordance with an embodiment of the present invention is illustrated. In order to create complicated shapes, the blocks 710–730 are assigned a priority attribute 710A–730A. The priority attribute 710A–730A determines which block 710–730 owns any overlap area relative to another block 710–730. The priority attribute 710A indicates that block 710 has priority over the overlap area relative to block 720. The priority attribute 720A indicates that block 720 has priority over the overlap area relative to block 730. The priority attribute 730A indicates that block 730 has priority over the overlap area relative to block 710.

FIG. 7B illustrates arrangement of the blocks of FIG. 7A during the floorplanning phase to form overlap areas 740A–740D in accordance with an embodiment of the present invention. Further, FIG. 7C illustrates allocation of the overlap areas 740A–740D of FIG. 7B based on the priority attributes 710A–730A of FIG. 7A in accordance with an embodiment of the present invention.

Figure 8A:
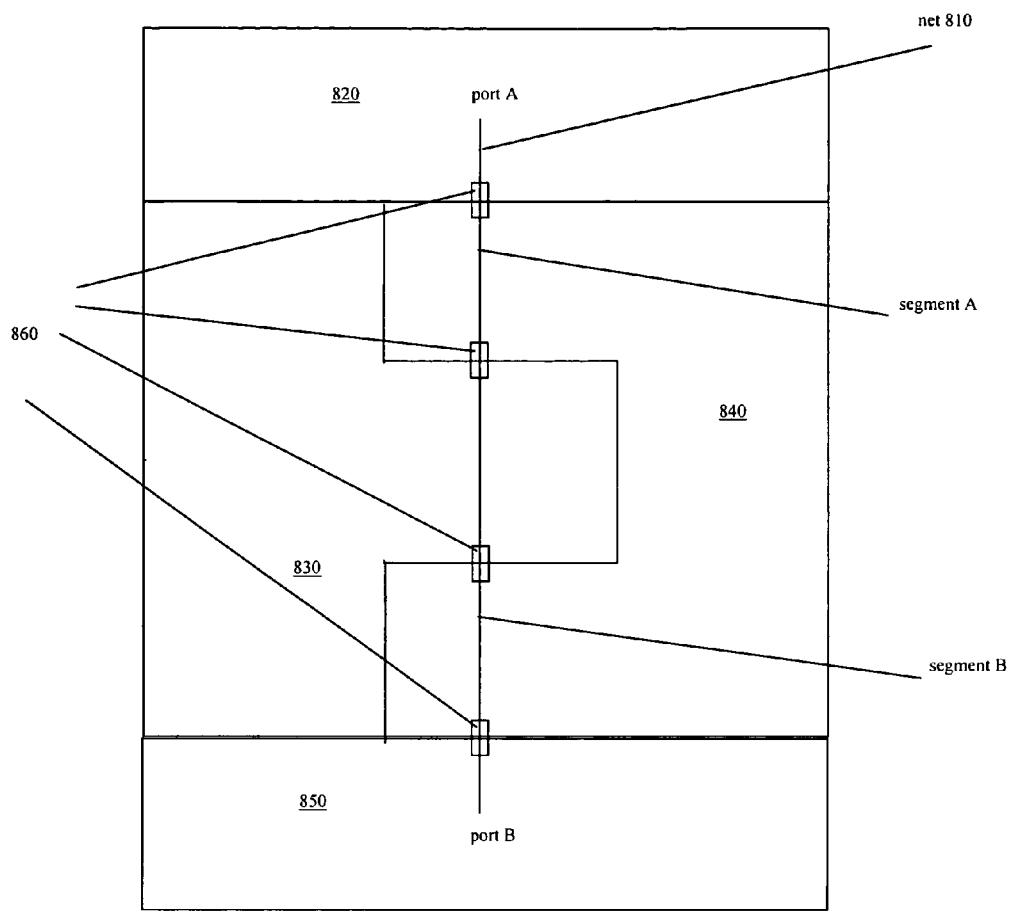
FIG. 8A illustrates a top-level routing of a net to determine pin location for a plurality of blocks in accordance with an embodiment of the present invention.
Figure 8B:
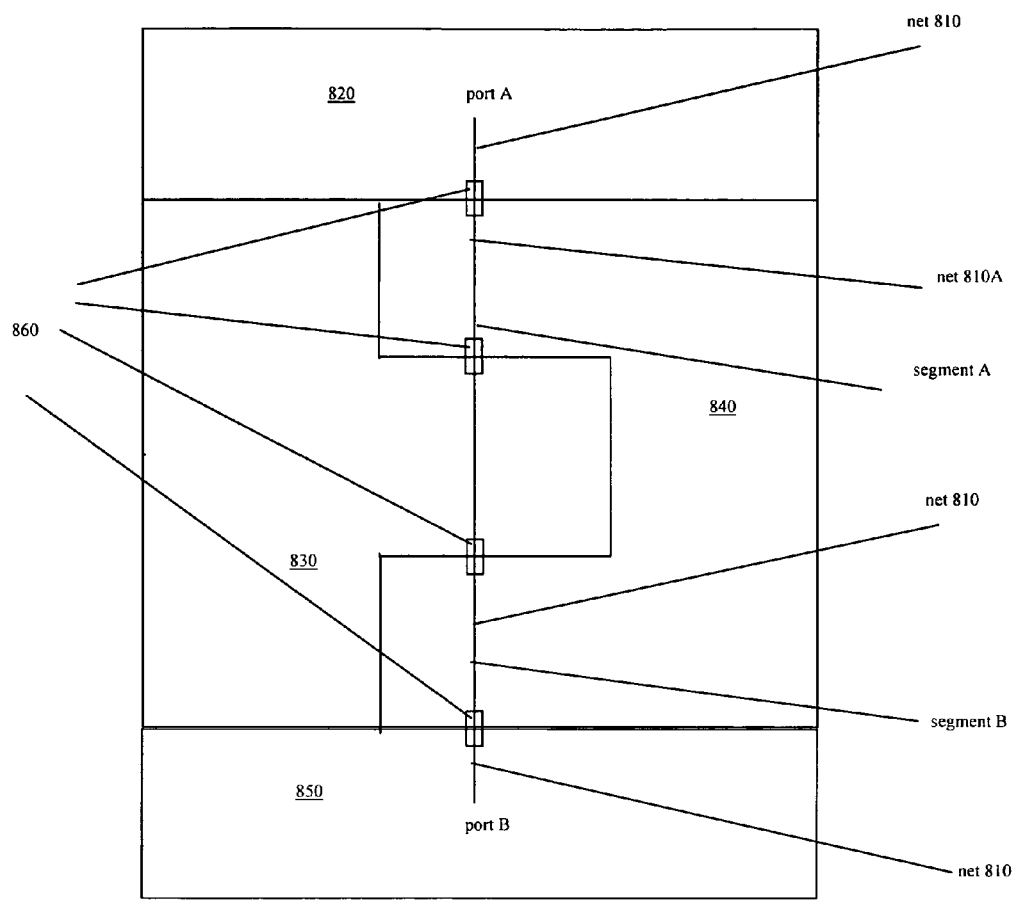
FIG. 8B illustrates renaming of a segment of the net of FIG. 8A in accordance with an embodiment of the present invention.

A method of floorplanning a hierarchical physical design is shown in FIGS. 8A–8B in accordance with an embodiment of the present invention. The method includes arranging a plurality of blocks in a top-level of the hierarchical physical design. Moreover, a plurality of nets is routed in the top-level of the hierarchical physical design to determine pin locations for each block. Each pin of each block represents one of a location where a signal enters the block and a location where a signal exits the block. Continuing, it is determined whether a routed net includes a plurality of segments within a block. Furthermore, one or more of the segments are renamed.

FIG. 8A illustrates a top-level routing of a net 810 to determine pin location for a plurality of blocks 820–850 in accordance with an embodiment of the present invention. Here, the net 810 connects port A of block 820 and port B of block 850. As shown in FIG. 8A, a plurality of pins 860 are defined where the routing of the net cross a block boundary. In particular, the net 810 has segment A and segment B within the block 840. This situation can cause routing problems when routing block 840 at the block-level.

FIG. 8B illustrates renaming of a segment of the net 810 of FIG. 8A in accordance with an embodiment of the present invention. To avoid routing problems, one of the segments (segment A or segment B) is renamed. Here, segment A has been renamed net 810A while segment B retains its net 810 name. It should be understood that if net 810 has more than two segments within a block, only one segment can retain the net 810 name In an embodiment, the methods of the present invention are performed by computer-executable instructions stored in a computer-readable medium, such as a magnetic disk, CD-ROM, an optical medium, a floppy disk, a flexible disk, a hard disk, a magnetic tape, a RAM, a ROM, a PROM, an EPROM, a flash-EPROM, or any other medium from which a computer can read.

Figure 9:
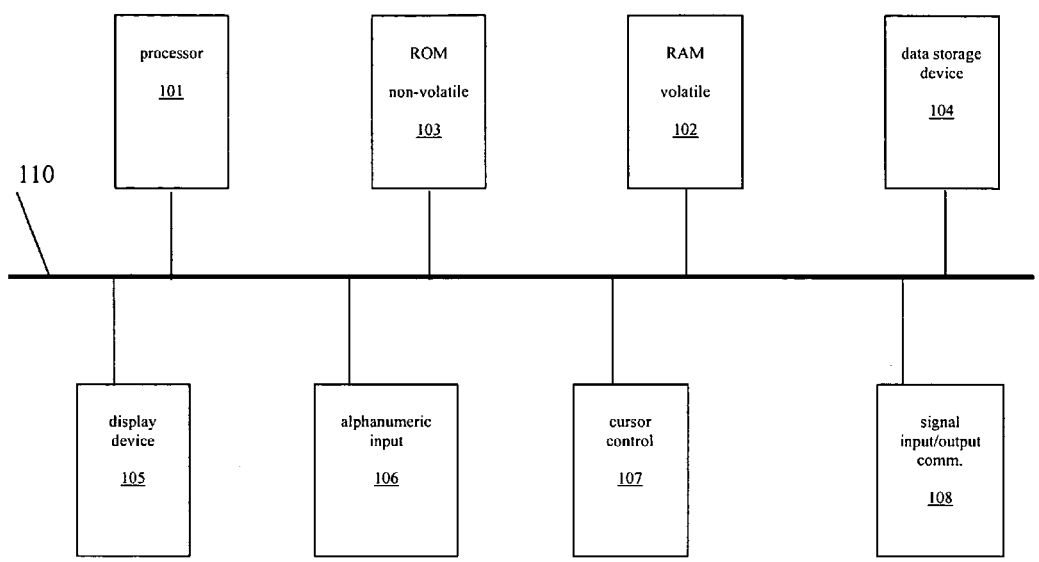
FIG. 9 illustrates an exemplary computer system on which embodiments of the present invention may be practiced.

FIG. 9 illustrates an exemplary computer system 900 on which embodiments of the present invention may be practiced. Aspects of the present invention can be implemented or executed on a computer system or any other computational system. Although a variety of different computer systems can be used with the present invention, an exemplary computer system 900 is shown in FIG. 9.

With reference to FIG. 9, portions of the present invention are comprised of computer-readable and computer executable instructions which reside, for example, in computer-usable media of an electronic system such as the exemplary computer system 900. FIG. 9 illustrates an exemplary computer system 900 on which embodiments of the present invention may be practiced. It is appreciated that the computer system 900 of FIG. 9 is exemplary only and that the present invention can operate within a number of different computer systems including general-purpose computer systems and embedded computer systems.

Computer system 900 includes an address/data bus 110 for communicating information, a central processor 101 coupled with bus 110 for processing information and instructions, a volatile memory 102 (e.g., random access memory RAM) coupled with the bus 110 for storing information and instructions for the central processor 101 and a non-volatile memory 103 (e.g., read only memory ROM) coupled with the bus 110 for storing static information and instructions for the processor 101. Exemplary computer system 900 also includes a data storage device 104 ("disk subsystem") such as a magnetic or optical disk and disk drive coupled with the bus 110 for storing information and instructions. Data storage device 104 can include one or more removable magnetic or optical storage media (e.g., diskettes, tapes) which are computer-readable memories. Memory units of computer system 900 include volatile memory 102, non-volatile memory 103 and data storage device 104.

Exemplary computer system 900 can further include a signal generating device 108 (e.g., a network interface card "NIC") coupled to the bus 110 for interfacing with other computer systems. Also included in exemplary computer system 900 of FIG. 9 is an alphanumeric input device 106 including alphanumeric and function keys coupled to the bus 110 for communicating information and command selections to the central processor 101. Exemplary computer system 900 also includes a cursor control or directing device 107 coupled to the bus 110 for communicating user input information and command selections to the central processor 101. A display device 105 can also be coupled to the bus 110 for displaying information to the computer user. Display device 105 may be a liquid crystal device, other flat panel display, cathode ray tube, or other display device suitable for creating graphic images and alphanumeric characters recognizable to the user. Cursor control device 107 allows the user to dynamically signal the two-dimensional movement of a visible symbol (cursor) on a display screen of display device 105. Many implementations of cursor control device 107 are known in the art including a trackball, mouse, touch pad, joystick or special keys on alphanumeric input device 106 capable of signaling movement of a given direction or manner of displacement. Alternatively, it will be appreciated that a cursor can be directed and/or activated via input from alphanumeric input device 106 using special keys and key sequence commands.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of floorplanning a hierarchical physical design, said method comprising:

arranging a plurality of blocks in a top-level of said hierarchical physical design, wherein each block includes a plurality of linear edges;

selecting at least one of said blocks; and rasterizing at least one linear edge of said selected block, to provide an edge transition for controlling routing zones associated with a top-level floorplan wherein said rasterizing includes converting said linear edge to a stepped-shape edge.

2. The method as recited in claim 1 wherein said arranging said blocks includes:

sizing said blocks; and shaping said blocks.

3. The method as recited in claim 1 wherein each step of said stepped-shape edge is sized to avoid dividing a routing track.

4. The method as recited in claim 1 wherein a step of said stepped-shape edge is sized according to a cell of said selected block.

5. The method as recited in claim 1 further comprising:
rasterizing each linear edge of said selected block to form a diamond-shape block having stepped-shape edges.

6. The method as recited in claim 1 wherein said hierarchical physical design is an abutted-pin hierarchical physical design.

7. A computer-readable medium comprising computer-executable instructions stored therein for performing a method of floorplanning a hierarchical physical design, said method comprising:
arranging a plurality of blocks in a top-level of said hierarchical physical design, wherein each block includes a plurality of linear edges;
selecting at feast one of said blocks; and
rasterizing at least one linear edge of said selected block, to provide an edge transition for controlling routing zones associated with a top-level floorplan wherein said rasterizing includes converting said linear edge to a stepped-shape edge.

8. The computer-readable medium as recited in claim 7 wherein said arranging said blocks includes:
sizing said blocks; and
shaping said blocks.

9. The computer-readable medium as recited in claim 7 wherein each step of said stepped-shape edge is sized to avoid dividing a routing track.

10. The computer-readable medium as recited in claim 7 wherein a step of said stepped-shape edge is sized according to a cell of said selected block.

11. The computer-readable medium as recited in claim 7 further comprising:
rasterizing each linear edge of said selected block to form a diamond-shape block having stepped-shape edges.

12. The computer-readable medium as recited in claim 7 wherein said hierarchical physical design is an abutted-pin hierarchical physical design.

* * * * *

UNITED STATES PATENT AND TRADEMARK OFFICE
CERTIFICATE OF CORRECTION

| | | |
|---|---|---|
| PATENT NO. | : 7,155,693 B1 | Page 1 of 1 |
| APPLICATION NO. | : 10/831700 | |
| DATED | : December 26, 2006 | |
| INVENTOR(S) | : Paul Rodman | |

It is certified that error appears in the above-identified patent and that said Letters Patent is hereby corrected as shown below:

Column 11, line 14 delete "feast" and insert --least--

Signed and Sealed this

Twentieth Day of March, 2007

JON W. DUDAS
*Director of the United States Patent and Trademark Office*